US012688882B2

(12) United States Patent
Mirichigni et al.

(10) Patent No.: US 12,688,882 B2
(45) Date of Patent: Jul. 21, 2026

(54) ROW ACTIVATION INDICATION REGISTERS

(71) Applicant: Micron Technology, Inc., Boise, ID (US)

(72) Inventors: Graziano Mirichigni, Vimercate (IT); Antonino Caprì, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 188 days.

(21) Appl. No.: 18/749,370

(22) Filed: Jun. 20, 2024

(65) Prior Publication Data

US 2025/0006248 A1    Jan. 2, 2025

Related U.S. Application Data

(60) Provisional application No. 63/524,567, filed on Jun. 30, 2023.

(51) Int. Cl.
G11C 11/408 (2006.01)
G11C 11/4076 (2006.01)

(52) U.S. Cl.
CPC ...... G11C 11/4085 (2013.01); G11C 11/4076 (2013.01)

(58) Field of Classification Search
CPC ........................ G11C 11/4085; G11C 11/4076
See application file for complete search history.

(56) References Cited

U.S. PATENT DOCUMENTS

| | | | |
|---|---|---|---|
| 11,074,949 B2 | 7/2021 | Mirichigni et al. | |
| 11,887,688 B2 | 1/2024 | Mirichigni et al. | |
| 2017/0060692 A1* | 3/2017 | Huang | G06F 11/142 |
| 2019/0130993 A1* | 5/2019 | Kim | G11C 29/787 |
| 2023/0016520 A1 | 1/2023 | Sforzin et al. | |

* cited by examiner

*Primary Examiner* — Alexander Sofocleous
*Assistant Examiner* — Joseph Fidelis Stormes
(74) *Attorney, Agent, or Firm* — Brooks, Cameron & Huebsch, PLLC

(57) ABSTRACT

Methods, systems, and devices related to row activation indication registers are disclosed. A first register can be coupled to a memory device and configured to store an indication of a first number of bit locations of a row address corresponding to the memory device to use in association with optimization of a row precharge time (tRP) of the memory device. A second register can be coupled to the memory device and configured to store an indication of a second number of bit locations of the row address to use in association with optimization of a row address to column address delay (tRCD) of the memory device.

20 Claims, 4 Drawing Sheets

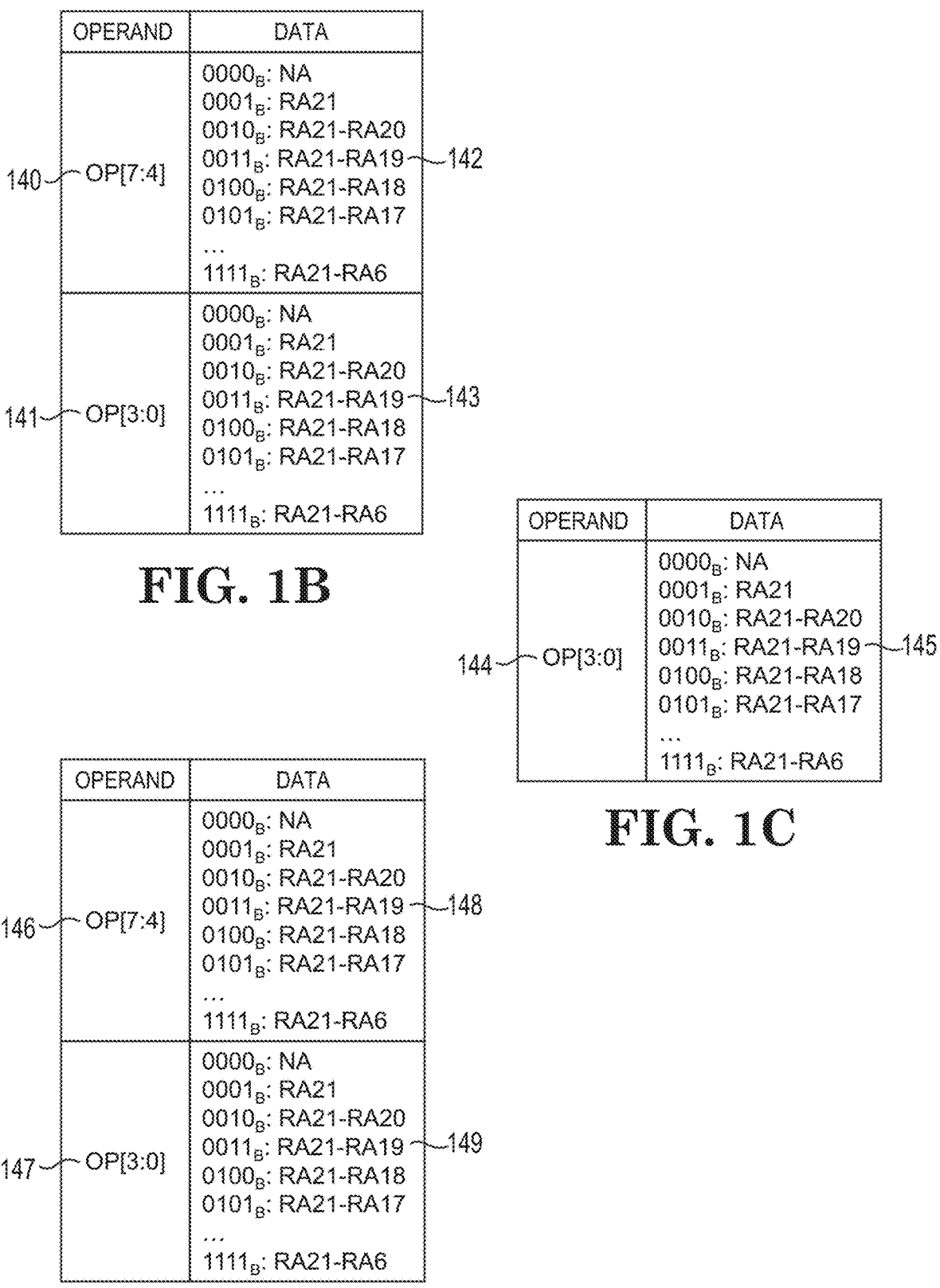

| OPERAND | DATA |
|---------|------|
| 140 ～ OP[7:4] | $0000_B$: NA<br>$0001_B$: RA21<br>$0010_B$: RA21-RA20<br>$0011_B$: RA21-RA19 ～142<br>$0100_B$: RA21-RA18<br>$0101_B$: RA21-RA17<br>...<br>$1111_B$: RA21-RA6 |
| 141 ～ OP[3:0] | $0000_B$: NA<br>$0001_B$: RA21<br>$0010_B$: RA21-RA20<br>$0011_B$: RA21-RA19 ～143<br>$0100_B$: RA21-RA18<br>$0101_B$: RA21-RA17<br>...<br>$1111_B$: RA21-RA6 |

FIG. 1B

| OPERAND | DATA |
|---------|------|
| 144 ～ OP[3:0] | $0000_B$: NA<br>$0001_B$: RA21<br>$0010_B$: RA21-RA20<br>$0011_B$: RA21-RA19 ～145<br>$0100_B$: RA21-RA18<br>$0101_B$: RA21-RA17<br>...<br>$1111_B$: RA21-RA6 |

FIG. 1C

| OPERAND | DATA |
|---------|------|
| 146 ～ OP[7:4] | $0000_B$: NA<br>$0001_B$: RA21<br>$0010_B$: RA21-RA20<br>$0011_B$: RA21-RA19 ～148<br>$0100_B$: RA21-RA18<br>$0101_B$: RA21-RA17<br>...<br>$1111_B$: RA21-RA6 |
| 147 ～ OP[3:0] | $0000_B$: NA<br>$0001_B$: RA21<br>$0010_B$: RA21-RA20<br>$0011_B$: RA21-RA19 ～149<br>$0100_B$: RA21-RA18<br>$0101_B$: RA21-RA17<br>...<br>$1111_B$: RA21-RA6 |

FIG. 1D

ROW ACTIVATION INDICATION REGISTERS

PRIORITY INFORMATION

This application claims the benefit of Provisional Application No. 63/524,567, filed on Jun. 30, 2023, the contents of which are incorporated herein by reference.

TECHNICAL FIELD

The present disclosure relates generally to semiconductor memory and methods, and more particularly, to apparatuses, systems, and methods of row activation indication registers.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes Random Access Memory (RAM), Dynamic Random Access Memory (DRAM), Static Random Access Memory (SRAM), Synchronous Dynamic Random Access Memory (SDRAM), and Thyristor Random Access Memory (TRAM), among others. Non-volatile memory can provide persistent data by retaining stored data when not powered and can include NAND flash memory, NOR flash memory, Ferroelectric Random Access Memory (FeRAM), and resistance variable memory such as Phase Change Random Access Memory (PCRAM), Resistive Random Access Memory (RRAM), and Magnetoresistive Random Access Memory (MRAM), such as Spin Torque Transfer Random Access Memory (STTRAM), among others.

Memory devices may be coupled to a host (e.g., a host computing device) to store data, commands (also referred to as requests), and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

BRIEF DESCRIPTION OF THE DRAWINGS

FIG. 1B illustrates an example of data stored by capability registers of memory devices in accordance with a number of embodiments of the present disclosure.

FIG. 1C illustrates an example of data stored by configuration registers of memory devices in accordance with a number of embodiments of the present disclosure.

FIG. 1D illustrates an example of data stored by a configuration register of a controller of a memory module in accordance with a number of embodiments of the present disclosure.

DETAILED DESCRIPTION

Figure 1A:
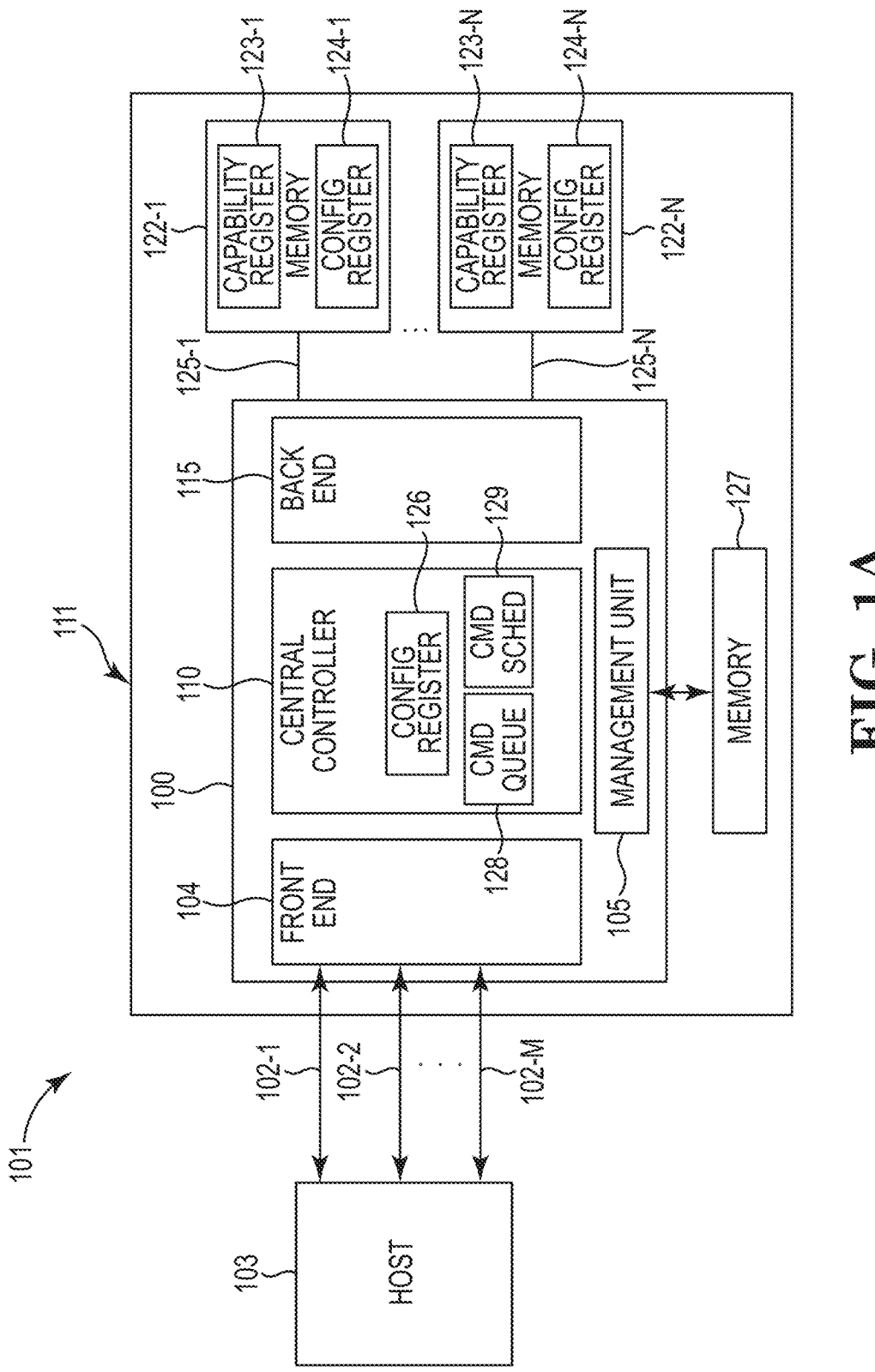
FIG. 1A illustrates a functional block diagram in the form of a computing system including a memory module including row activation indication registers in accordance with a number of embodiments of the present disclosure.

Systems, apparatuses, and methods related to row activation indication registers are described. To access a memory cell within a row of a subarray (e.g., of a bank) of a memory device, separate operations can be performed. These operations can be triggered by separate, corresponding commands (e.g., from a host device or a controller thereof) to the memory device. For example, a memory device can receive an activation command associated with a row of memory cells. The activation command can trigger an activation operation that opens the associated row of memory cells. Subsequent to receipt of the activation command, the memory device can receive a data access command (e.g., read, write) associated with the opened row. In response to the data access command, the memory device can read data from or write data to one or more memory cells of the opened row, for example. The memory device can subsequently receive a precharge command associated with the opened row. In response to the precharge command, the memory device can close the opened row, which may complete the row access operation.

Each step of a row access operations (e.g., activating, accessing, precharging) may have a corresponding latency. In some previous approaches, a memory device may support timing signals (e.g., phases) associated with executing activation, data access, and precharge commands that may trigger internal operations for accessing one or more memory cells of a row. In some previous approaches, if a previous row access operation is still ongoing in a particular bank, then it may not be possible to initiate an activation operation to open another row of memory cells in the same bank. For example, if the previously accessed row is still open (e.g., has not yet been closed at the end of the precharge operation), then a different row within the bank and/or a different portion of memory of the open row of the bank is not accessible. The amount of time (delay) between completion of a precharge operation (e.g., closing one or more rows of memory cells) and an activation command for a subsequent row of memory cells may increase latency and the amount of time to accessing rows of memory cells of a memory device.

Aspects of the present disclosure address the above and other deficiencies of previous approaches. Some embodiments of the present disclosure include a memory device that can receive an indication (e.g., a hint) associated with a subsequent activation command. The indication can enable a memory device to begin one or more aspects of an activation operation of a subsequent (e.g., next) row prior to receiving the subsequent associated activation command. For example, the indication can include a location (e.g., a subarray index, a row address) of a subsequent row to be accessed. In some examples, the location of the subsequent row access operation can be in a same subarray (e.g., of a bank) or a different subarray (e.g., of a bank) as a row previously or currently accessed. In some examples, the indication can be included in a previous activation command or precharge command. For instance, upon receiving an indication associated with a subsequent row with a precharge command, a memory device can begin activation operations for a subsequent (next) row access operation before a precharge operation associated with another row access operation is complete. The memory device can receive an activation command associated with a subsequent row access operation after receiving the indication and complete the activation operation in response to receiving the corresponding activation command. The memory device can perform portions of an activation operation associated with a subsequent row access operation substantially simultaneously with a precharge operation associated with an ongoing row access operation. By performing one or more portions of an activation operation before receiving a corresponding activation command, overall latency of a subsequent access operation can be reduced, which can improve performance of a memory device.

As used herein, the term "substantially" intends that the characteristic may not be absolute but is close enough so as to achieve the advantages of the characteristic. For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces, media controllers that are utilized "substantially simultaneously" may not start or finish at exactly the same time. For example, the multiple memory controllers can be utilized such that they are writing data to the memory devices at the same time regardless if one of the media controllers commences or terminates prior to the other.

In some embodiments, a memory device can utilize an indication as described herein to reduce and/or optimize a row precharge time (tRP) and/or a row address to column address delay (tRCD). As used herein, "tRP" refers to an amount of time between receipt of a precharge command or initiation of a precharge operation and initiation of an associated activation operation within a same bank. Optimization of a tRP can include reducing (e.g., minimizing) the amount of time between receipt of a precharge command or initiation of a precharge operation and initiation of an associated activation operation within a same bank.

As used herein, "tRCD" refers to an amount of time between receipt of an activation command or initiation of an activation operation and initiation of an associated data access operation. As used herein, "data access command" and "data access operation" refer to a command or operation, respective, to read, write, or otherwise access data stored by a memory device (e.g., one or more memory cells of a row of the memory device). Optimization of a tRCD can include reducing (e.g., minimizing) the amount of time between receipt of an activation command or initiation of an activation operation and initiation of an associated data access operation.

Optimization of tRP and/or tRCD of memory devices can facilitate interoperability between a memory controller and the memory devices. A memory controller needs to know the quantity of bits (how many bits) of a row address and/or the locations of those bits (which bits of the row address) to check for optimization of tRP. The respective locations of one or more bits of a row address can be referred to herein as bit locations. More particularly, the memory controller needs to know which subarray row address bits to determine whether to use a default tRP, a shortened (e.g., optimized) tRP (tRP_S), or a null precharge time (tRP_Z). To optimize tRCD, a memory controller needs to know the quantity of (how many) bits of a row address and/or the locations of these bits within the row address to send to one or more memory devices. More particularly, the memory controller needs to know the subarray row address bits and additional row address bits to send to one or more memory devices during execution of a precharge command so as to "hint" at a subsequent (e.g., next) target of an associated activation command, such as the same subarray or a different subarray.

In some embodiments, tRP optimization and tRCD optimization can be implemented and enabled separately (e.g., tRP optimization or tRCD optimization is implemented and enabled). In some embodiments, both tRP optimization and tRCD optimization can be implemented and enabled. A memory controller (e.g., a memory device controller, a memory module controller, a memory system controller) can support multiple combinations of tRP optimizations and tRCD optimizations, without impacting the functionality. As described further herein, various embodiments can include use of registers (e.g., on a memory device) to indicate whether the device supports one or both of tRP and tRCD optimization features and, if supported, whether one or both of the tRP and tRCD optimization features are enabled. The registers can also indicate which subarray row address bits and/or other row address bits of a group of row address bits are to be used in association with performing the tRP and tRCD optimization features.

In some embodiments, a memory device can include a register to store an indication (e.g., a binary indication) of whether the memory device supports optimization of tRP and/or optimization of tRCD. A memory device can include a register to store an indication of which bits (e.g., bit locations) of row addresses of the memory device to use in association with tRP optimization. A memory device can include a register to store an indication of which subarrays of the memory device and which bits (e.g., bit locations) of row addresses of the memory device to use in association with tRCD optimization. A memory device can include a register to store an indication of which bits (e.g., bit locations) of row addresses of the memory device to send as a hint (e.g., hint bits) in association with tRCD optimization.

In some embodiments, a memory controller can include a register to store an indication of which bits (e.g., bit locations) of row addresses of the memory device to use in association with tRP optimization (and configuration thereof). A memory controller can include a register to store an indication of which subarrays of the memory device and which bits (e.g., bit locations) of row addresses of the memory device to use in association with tRCD optimization (and configuration thereof). Such a register can be used by the memory controller to generate and/or manage one or more command queues and command scheduling in association with tRP optimization and/or tRCD optimization.

Managing a large quantity of banks (e.g., 32 banks) of a memory device can consume resources of a memory controller (e.g., hardware resources, timings closure). In some embodiments, a memory controller can treat one or more banks of one or more memory devices as a sub-bank (e.g., subarray), which can reduce implementation complexity and/or costs (e.g., resources) and/or improve performance (e.g., reduce latency).

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. The terms "data" and "data values" are used interchangeably herein and can have the same meaning, as appropriate to the context.

The figures herein follow a numbering convention in which the first digit or digits correspond to the drawing figure number and the remaining digits identify an element or component in the drawing. Similar elements or components between different figures may be identified by the use of similar digits. For example, element 122 can represent element 22 in FIG. 1, and a similar element can be labeled 222 in FIG. 2. Analogous elements within a figure may be referenced with a hyphen and extra numeral or letter. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates a functional block diagram in the form of a computing system 101 including a memory module 111 including row activation indication registers in accordance with a number of embodiments of the present disclosure. The computing system 101 includes a memory module 111. The memory module 111 can include a controller 100 (which may also be referred to herein as a "memory controller") and one or more memories and/or memory devices coupled thereto.

The controller 100 can include a front end portion 104, a central controller portion 110, and a back end portion 115. The computing system 101 can further include a host 103, memory devices 122-1, . . . , 122-N (collectively referred to as memory devices 122), and a memory 127. The memory 127 can be a flash memory accessible via a serial peripheral interface (SPI). The memory 127 can include other circuitry, firmware, software, or the like, whether alone or in combination.

The front end portion 104 includes an interface to couple the controller 100 to the host 103 through input/output (I/O) lanes 102-1, 102-2, . . . , 102-M (collectively referred to as I/O lanes 102). The front end portion 104 includes interface management circuitry to manage the I/O lanes 102. The front end portion 104 can include any quantity of the I/O lanes 102 (e.g., eight, sixteen I/O lanes 102). In some embodiments, the I/O lanes 102 can be configured as a single port. In some embodiments, the interface between the controller 100 and the host 103 can be a Peripheral Component Interconnect express (PCIe) physical and electrical interface operated according to a Compute Express Link (CXL) protocol.

In some embodiments, the computing system 101 can be a CXL compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as I/O protocol, memory protocol (e.g., initially allowing a host to share memory with an accelerator), and coherency interface.

The back end portion 115 can include media control circuitry and a physical (PHY) layer that couples the controller 100 to the memory devices 122. As used herein, the term "PHY layer" generally refers to the physical layer in the Open Systems Interconnection (OSI) model of a computing system. The PHY layer can be the first (e.g., lowest) layer of the OSI model and used to transfer data over a physical data transmission medium. In some embodiments, the physical data transmission medium can include channels 125-1, . . . , 125-N (collectively referred to as the channels 125). The channels 125 can include a sixteen-pin data bus and a two pin data mask inversion (DMI) bus, for example, among other possible buses. The channels 125 can each include an input/output data (DQ) bus and a data strobe (DQS) bus. The back end portion 115 can communicate (e.g., transmit and/or receive) data to and/or from the memory devices 122 via the data pins.

One or more of the memory devices 122 can include DRAM. DRAM can be operated according to a particular protocol, such as double data rate (DDRx), with the "x" referring to a particular generation of the protocol (e.g., DDR4, DDR5, etc.) (e.g., DDRx DRAM devices, DDRx memory, etc.). In some embodiments, DRAM can be operated as low-power double data rate (LPDDRx), (e.g., LPDDRx DRAM devices, LPDDRx memory, etc.). The "x" in LPDDRx refers to any of a number of generations of the protocol (e.g., LPDDR5). In some embodiments, at least one of the memory devices 122 is operated as an LPDDRx DRAM device with low-power features enabled and at least one of the memory devices 122 is operated as an LPDDRx DRAM device with at least one low-power feature disabled. In some embodiments, the memory devices 122 are LPDDRx memory devices, but the memory devices 122 do not include circuitry configured to provide low-power functionality, such as a dynamic voltage frequency scaling core (DVFSC), a sub-threshold current reduce circuit (SCRC), or other low-power functionality providing circuitry. The LPDDRx memory devices 122 without such circuitry can advantageously reduce the cost, size, and/or complexity of the LPDDRx memory devices 122. By way of example, an LPDDRx memory device with reduced low-power functionality providing circuitry can be used for applications other than mobile applications (e.g., if the memory is not intended to be used in a mobile application, some or all low-power functionality can be sacrificed for a reduction in the cost of producing the memory).

One or more of the memory devices 122 can include FeRAM, PCRAM, RRAM, MRAM, and STTRAM, among others. The memory devices 122 are not limited to a particular type of memory device. For instance, the memory devices 122 can include RAM, ROM, DRAM, SDRAM, PCRAM, RRAM, and flash memory, among others. The memory devices 122 can include non-volatile memory devices such as non-volatile random-access memory devices (e.g., NVRAM, ReRAM, FeRAM, MRAM, PCM), "emerging" memory devices such as a ferroelectric RAM device that includes ferroelectric capacitors that can exhibit hysteresis characteristics, a 3-D Crosspoint (3D XP) memory device, etc., or combinations thereof.

As an example, a FeRAM device can include ferroelectric capacitors and can perform bit storage based on an amount of voltage or charge applied thereto. In such examples, relatively small and relatively large voltages allow the ferroelectric RAM device to exhibit characteristics similar to normal dielectric materials (e.g., dielectric materials that have a relatively high dielectric constant) but at various voltages between such relatively small and large voltages the FeRAM device can exhibit a polarization reversal that yields non-linear dielectric behavior.

As another example, a 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation in which a non-volatile memory cell can be programmed without the non-volatile memory cell being previously erased. Although not illustrated by FIG. 1A, in some embodiments, one or more of the memory devices 122 can include a local controller that can operate in conjunction with the controller 100 to execute operations on one or more memory cells of the memory devices 122. An external controller (e.g., the controller 100) can externally manage the memory devices 122 (e.g., perform media management operations on the memory device 122).

In some embodiments, one or more of the memory devices 122 can include respective capability registers 123-1, . . . , 123-N (referred collectively to as the capability registers 123) and respective configuration registers 124-1, . . . , 124-N (referred collectively to as the configuration registers 124). For example, each bank or subarray of one or more of the memory devices 122 can have a corresponding capability register 123 and a corresponding configuration register 124. The capability registers 123 can store an indication of whether the corresponding bank or subarray of the memory device 122 supports optimization of tRP and/or tRCD. As used herein, a memory device "supporting" optimization of tRP and/or tRCD refers to whether the memory device is capable of having the optimization of tRP and/or tRCD functions enabled. The configuration registers 124 can store an indication of whether optimization of tRCD for the corresponding bank or subarray of the memory device 122 is enabled. As used herein, "enabling" optimization of tRP and/or tRCD refers to configuring the device to use (e.g., to take advantage of) tRP and/or tRCD optimization functionality. Although FIG. 1A illustrates the capability registers 123 as distinct from the configuration registers 124, in some embodiments, the memory devices 122 can include a respective single register with a portion of that register corresponding to the capability register 123 and another portion of that register corresponding to the configuration register 124.

FIG. 1B illustrates an example of data (e.g., capability bits) stored by the capability registers 123 of the memory devices 122 in accordance with a number of embodiments of the present disclosure. The capability registers 123 can have read-only permission. As illustrated in FIG. 1B, the register 123 includes a first operand 140 and a second operand 141. In this example, the operands 140 and 141 each comprise four bits; however, embodiments are not limited to a particular number of bits for either of the operands. In this example, operand 141 is represented by bits 0-3 (e.g., OP[3:0]) of the register 123 and operand 140 is represented by bits 4-7 (e.g., OP[7:4]) of the register 123. In the example of FIG. 1B, the function of operand 140 is to indicate whether tRP optimization is supported by the device (e.g., 122) and to indicate the subarray row address (RA) bits and additional row address bits utilized for tRP optimization. The function of operand 141 is to indicate whether tRCD optimization is supported by the device (e.g., 122) and to indicate the subarray row address (RA) bits utilized for tRCD optimization. As illustrated at 142 and 143 of FIG. 1B, in this example, a binary value of "0000" for operand 140 indicates that tRP optimization is not supported by the device 122, and a binary value of "0000" for operand 141 indicates that tRCD optimization is not supported by the device 122. In this example, the other binary values for operands 140 and 141 indicate which row address bits are utilized for the respective optimization operation. For example, as shown at 142, a binary value of "0011" for operand 140 indicates that row address bits RA21-RA19 are utilized for tRP optimization, and as shown at 143, a binary value of "0101" for operand 141 indicates that row address bits RA21-RA17 are utilized for tRCD optimization.

FIG. 1C illustrates an example of data (e.g., configuration bits) stored by the configuration registers 124 of the memory devices 122 in accordance with a number of embodiments of the present disclosure. The configuration registers 124 can have read-write permissions. As illustrated in FIG. 1C, the register 124 includes an operand 144. In this example, the operand 144 comprises four bits; however, embodiments are not limited to a particular number of bits for the operand 144. In this example, operand 144 is represented by bits 0-3 (e.g., OP[3:0]) of the register 124. In the example of FIG. 1C, the function of operand 144 is to indicate whether tRCD optimization is enabled by the device (e.g., 122) and to indicate the subarray row address (RA) bits and other row address bits utilized for tRCD optimization. As illustrated at 145 of FIG. 1C, in this example, a binary value of "0000" for operand 144 indicates that tRCD optimization is not enabled by the device 122. In this example, the other binary values for operand 144 indicate which row address bits (e.g., subarray row address bits and other row address bits) are utilized for the tRCD optimization operation. For example, as shown at 145, a binary value of "0011" for operand 144 indicates that row address bits RA21-RA19 are utilized for tRCD optimization. In some embodiments, the configuration registers 124, or different registers of the memory devices 122, can store an indication of a quantity of subarrays and/or one or more particular subarrays of the memory devices 122 to use in association with optimization of tRCD.

In some embodiments, the controller 100 can include a management unit 105 to initialize, configure, and/or monitor characteristics of the controller 100. The management unit 105 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the controller 100. As used herein, the term "out-of-band data and/or commands" generally refers to data and/or commands transferred through a transmission medium that is different from the main transmission medium of a network. For example, out-of-band data and/or commands can be data and/or commands transferred to a network using a different transmission medium than the transmission medium used to transfer data within the network.

The central controller portion 110 can control, in response to receiving a memory access request from the host 103, for example, performance of one or more memory operations. Non-limiting examples of memory operations include a memory operation to read data from a memory device 122 and an operation to write data to a memory device 122. In some embodiments, the central controller portion 110 can control writing of multiple pages of data substantially simultaneously.

As illustrated by FIG. 1A, the central controller portion 110 can include a configuration register 126. However, in some embodiments, the configuration register 126, can be a component of the controller 100 other than the central controller portion 110 or external to the controller 100. The configuration register 126 can have read-write permissions.

FIG. 1D illustrates an example of data (e.g., configuration bits) stored by the configuration register 126 of the controller 100 of the memory module 111 in accordance with a number of embodiments of the present disclosure. As illustrated in FIG. 1D, the register 126 includes a first operand 146 and a second operand 147. In this example, the operands 146 and 147 each comprise four bits; however, embodiments are not limited to a particular number of bits for either of the operands. In this example, operand 147 is represented by bits 0-3 (e.g., OP[3:0]) of the register 126 and operand 146 is represented by bits 4-7 (e.g., OP[7:4]) of the register 126. In the example of FIG. 1D, the function of operand 146 is to indicate whether tRP optimization is currently enabled and to indicate the subarray row address (RA) bits utilized for tRP optimization. The function of operand 147 is to indicate whether tRCD optimization is currently enabled and to indicate the subarray row address (RA) bits and other row address bits utilized for tRCD optimization. As illustrated at 148 and 149 of FIG. 1B, in this example, a binary value of "0000" for operand 146 indicates that tRP optimization is not currently enabled, and a binary value of "0000" for operand 147 indicates that tRCD optimization is not currently enabled. In this example, the other binary values for operands 146 and 147 indicate which row address bits are utilized for the respective optimization operation. For example, as shown at 148, a binary value of "0010" for operand 146 indicates that row address bits RA21-RA20 are utilized for tRP optimization, and as shown at 149, a binary value of "0100" for operand 147 indicates that row address bits RA21-RA18 are utilized for tRCD optimization.

The central controller portion 110 can, in response to one or more of the capability registers 123 storing an indication that one or more of the memory devices 122 support optimization of tRP, adjust the tRP. The central controller portion 110 can, in response to one or more of the capability registers 123 storing an indication that one or more of the memory devices 122 support optimization of tRCD, adjust the tRCD based on an indication of bit locations of row addresses of the memory devices 122 stored in the configuration register 126 and/or the configuration registers 124 of the one or more memory devices 122.

Row addresses of the memory devices 122 can correspond to one or more banks of the memory devices 122. In some embodiments, the central controller portion 110 can manage a bank of one of the memory devices 122 as a subarray of another bank of the same memory device. The central controller portion 110 can manage a command queue 128 and a command schedule 129 based on data stored in the configuration register 126.

Figure 2:
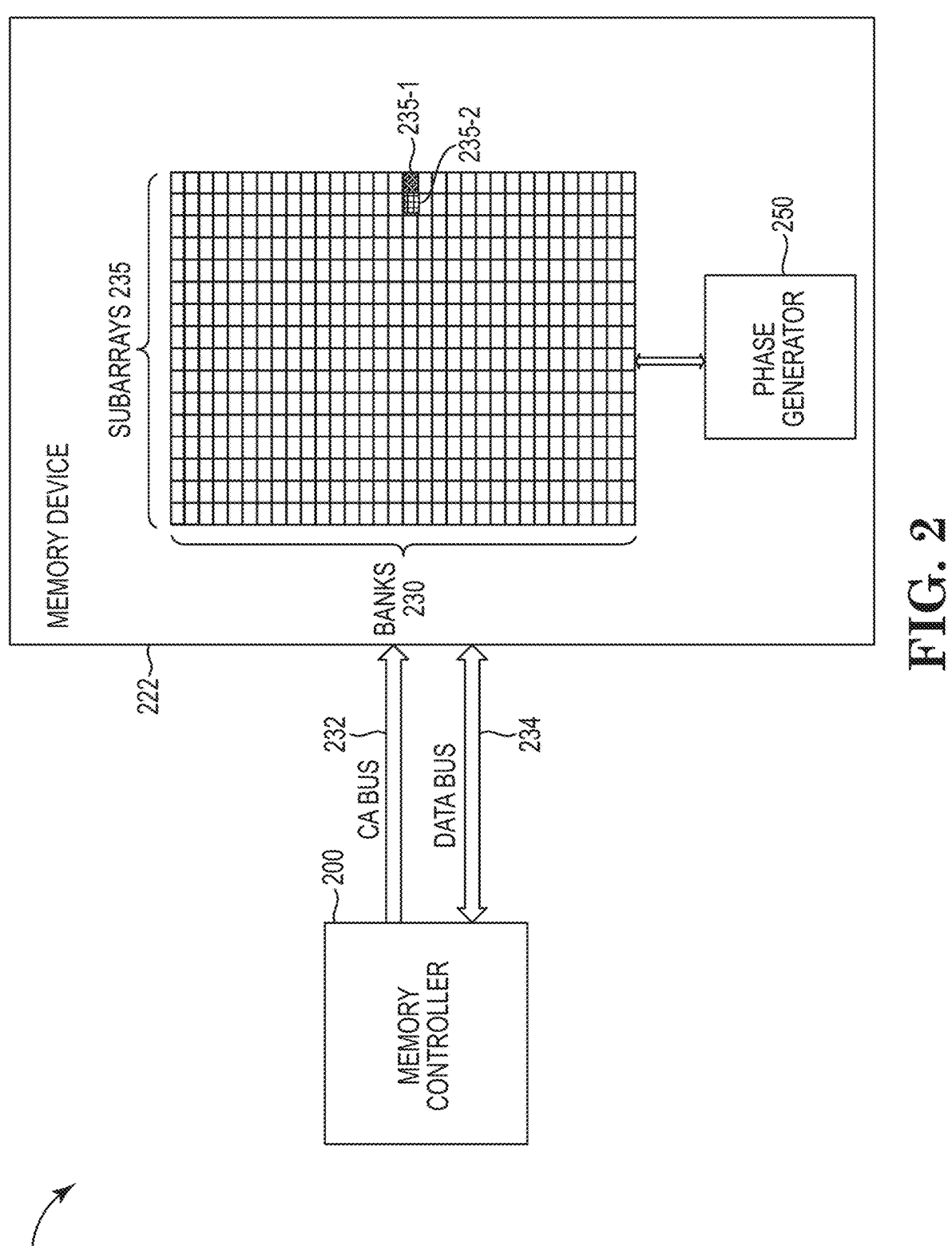
FIG. 2 illustrates a functional block diagram in the form of a memory module including a controller for indicating row activation in accordance with a number of embodiments of the present disclosure.

FIG. 2 illustrates a functional block diagram in the form of a memory module 211 including a controller 200 for indicating row activation in accordance with a number of embodiments of the present disclosure. The memory module 211, the memory controller 200, and the memory device 222 can be analogous to the memory module 111, the controller 100, and one or more of the memory devices 122, respectively, described in association with FIG. 1A. CA bus 232 and data bus 234 can be components of one or more of the channels 125. Data stored in memory device 222 can be accessible by the memory controller 200. A process of accessing data stored in the memory device 222 by the controller 200 can be referred to herein as an access operation and/or a data access operation.

An access operation, such as a read or write operation, can be communicated (e.g., sent by a host such as the host 103) to the memory device 222 as a series of commands (e.g., a command sequence). The commands can be communicated to the memory device 222 by the controller 200 over CA bus 232. The commands can be received by the memory device 222, and can trigger corresponding operations at the memory device 222 to read, write, or otherwise access data stored by the memory device 222 (e.g., at one or more memory cells of the memory device 222). The data stored in or written to the memory device 222 can be communicated between the memory controller 200 and the memory device 222 over data bus 234.

The memory device 222 can include multiple subarrays 235 (illustrated as small rectangles in FIG. 2). One or more of the subarrays 235 can be grouped into one or more banks 230 (illustrated as rows of the small rectangles in FIG. 2). In some examples, the memory device 222 can contain thirty-two banks, each of which can contain one or more subarrays 235. For instance, one or more of the banks 230 can contain sixteen subarrays 235. The subarray 235-1 and subarray 235-2, for example, can be components of the same bank. The subarrays 235 can each contain individual rows of memory cells that can store data associated with the memory device 222 or can have data written thereto.

In some examples, a command received by the memory device 222 can cause the memory device 222 to generate one or more related phases (e.g., using phase generator 250). Although FIG. 2 illustrates the phase generator 250 as a single component for simplicity, each of the banks 230 can have a respective phase generator 250. For each activate, data access, and/or precharge command received by the memory device 222 associated with a bank, the corresponding phase generator 250 for that bank can generate a related set of phases. The related set of phases can refer to or include timing signals that collectively trigger, or otherwise control, sequences of internal operations within one or more of the subarrays 235. Although not shown in FIG. 2, the memory device 222 can include internal control circuitry (e.g., a state machine and/or other control logic) configured to control the phase generator(s) 250 based on commands received from the memory controller 200.

In some examples, a command received by the memory device 222 (e.g., a command transmitted over the CA bus 232) can include an indication (e.g., a hint) of a location of a subsequent row (of memory cells) to be accessed by a subsequent (future) access operation. In some cases, the memory controller 200 can configure the command to include such an indication. For example, an activation command associated with opening a row of the subarray 235-1 can include an indication that a subsequent activation command can be associated with a row of a different subarray 235-2. In some examples, a precharge command can include such an indication. Upon receiving the indication, the phase generator 250 for the bank including the subarrays 232-1 and 232-2 can generate a set of timing signals (e.g., one or more related phases) such that at least a portion of the subsequent activation command can be executed before execution of the precharge command is completed and/or before the subsequent activation command is received by the memory device 222.

Execution of a command, and performance of one or more operations associated therewith, can include performing internal operations (e.g., an activation operation). Performance of an activation operation on one of the subarrays 235 can include one or more phase-controlled internal operations, performing an access operation such as a read or write operation (which can include one or more phase-controlled internal operations), and performing a precharge operation (which can include one or more phase-controlled internal operations). Thus, phases can govern the internal timing of access operations associated with a row of a subarray to which the access operations are directed. In some examples, the phases can be internal timing signals that trigger the electrical operations (e.g., the physical electrical operations) corresponding to the commanded operations on an individual row basis to access memory cells of a particular row.

Row access operations and data access operations can each have an associated latency. For example, the latency of a row access operation performed by the memory device 222 can be associated with the internal timing of a data access operation, which can be associated with the set of timing signals generated by the phase generator 250. In some examples, the set of timing signals can include a tRCD (e.g., the minimum time between an activation command and a data access command), which can be longer due to increased latency associated with the activation command or the data access operation. To reduce the time associated with the tRCD and decrease overall latency, the phase generator 250 can be enabled to execute a portion of an activation operation while a precharge operation is underway (e.g., substantially simultaneously with a precharge operation, based on an indication included in a previous signal. For example, based on an indication of a location (e.g., a row address) of a subsequent (e.g., next) row access operation, the phase generator 250 can perform a precharge operation at a row of the subarray 235-1 concurrent with the phase generator 250 beginning to perform an activation operation at a row of the subarray 235-2. In some examples, the phase generator 250 can execute a precharge operation at a row of the subarray 235-1 concurrent with beginning to perform an activation operation on the same row of the subarray 235-1. By enabling the phase generator 250 to generate timing signals that allow for overlap between closing a row of subarray (e.g., executing the precharge command) and opening another row of the same subarray or a row of a different subarray (e.g., executing a subsequent activation command), latency of the memory device 222 can be reduced and/or overall efficiency of a system including the memory device 222 can be improved.

The memory device 222 can include any number of the phase generators 250 (e.g., one per each bank 230). In some examples, subarray-level phases can enable parallel subarray operations. The phase generator 250 can include logic and/or other special-purpose circuitry, which can be included in, coupled to, or otherwise associated with one or more of the banks 230. Phases can be generated on a per-bank basis. Phases and other signals generated by the memory device 222, but outside of one or more of the subarrays 235 can include, be coupled to, or be otherwise associated with a respective phase generator 250. Phases can be generated locally for each subarray 235.

Global phases can be generated per bank. This can support different ones of the banks 230 being accessed substantially simultaneously (in parallel, with access to rows of the different banks at least partially overlapping in time). In some examples, an activation or precharge operation performed on a row of one of the banks 230 can occur substantially simultaneously with an activation or precharge operation on a row of a different one of the banks 230.

In some examples, each subarray 235 can include, use, or otherwise be associated with a corresponding row buffer for accessing the data stored in the subarray 235. Additionally or alternatively, each subarray 235 of a bank 230 can include, use, or otherwise be associated with a corresponding latching circuit (not illustrated), which can duplicate phases associated with the subarray 235 and/or maintain (e.g., preserve, store) the phases independent of phases associated with the remaining subarrays 235 of the bank 230 or the memory device 222. For example, a latching circuit can store duplicate versions (e.g., copies) of global phases or other signals associated with (e.g., for executing operations on) the corresponding subarray 235. Latching circuits can enable improvement of the memory module 211 in accordance with a number of embodiments described herein. For example, this can support multiple subarrays 235 of a same bank being accessed substantially simultaneously (e.g., in parallel, with accesses to rows of the subarrays 235 of that bank at least partially overlapping in time). For example, an activation or precharge operation performed on a row of the subarray 235-1 of a bank 230 can occur substantially simultaneously with an activation or precharge operation on a row of the subarray 235-2 of that bank.

Accessing a row can involve one or more operations, and each operation can contribute to the overall latency of accessing the row. Such operations can be based on (e.g., in response to) corresponding commands, which can be communicated by the memory controller 200 to the memory device 222. The commands to access a row of a subarray 235 of a bank 230 can include an activation command (e.g., corresponding to an activation operation to "open" a row), a data access command (e.g., corresponding to a read operation or a write operation), and a precharge command to "close" the previously opened row.

An activation operation, an access operation, and a precharge operation can be performed to access a row of memory cells of a subarray 235 of a bank 230. In some examples, the activation operation can be performed before an access operation to open the row. Additionally, the precharge operation can be performed to close the activated row. In some cases, a precharge operation can be performed before a subsequent access operation of a row of the same bank 230. The corresponding commands can be communicated from the memory controller 200 to the memory device 222 as a series of commands (e.g., a command sequence). The commands can include an activation command, a data access command, and a precharge command, and can be received in the order the corresponding operations are performed.

Figure 3:
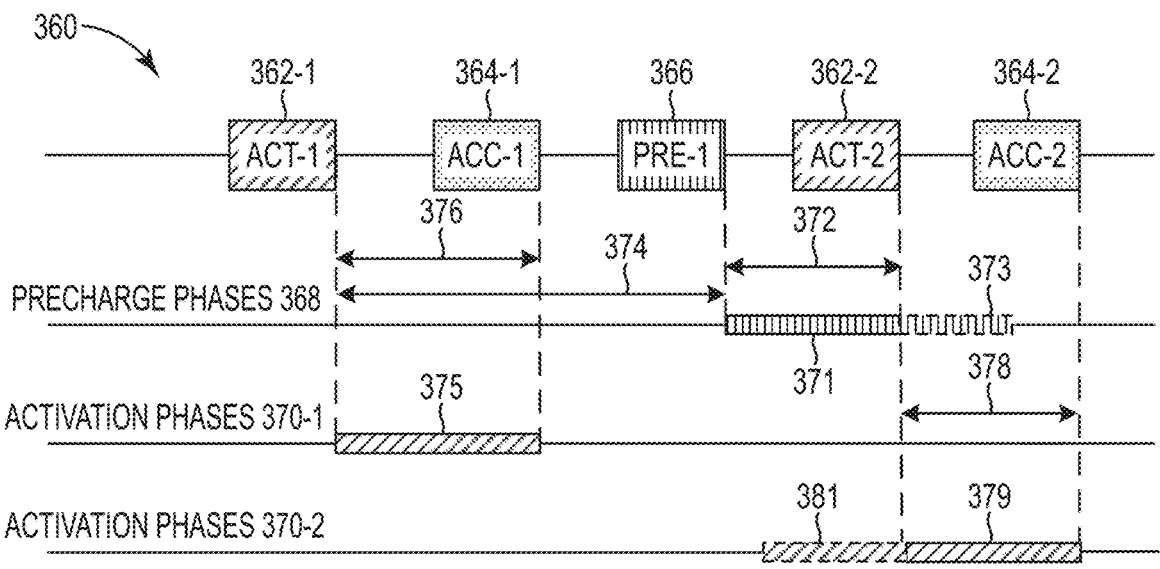
FIG. 3 illustrates an example of a command timeline for indicating row activation in accordance with a number of embodiments of the present disclosure.

FIG. 3 illustrates an example of a command timeline 360 for indicating row activation in accordance with a number of embodiments of the present disclosure. The command timeline 360 illustrates an example in which the indication identifies a subsequent row that is accessed (e.g., a hint hit). The row and the subsequent row are in different subarrays of the memory device (e.g., the memory device 222 described in association with FIG. 2). FIG. 3 illustrates an example of a "hint hit" scenario in which an activation command 362-1 and/or the precharge command 366 includes an indication (e.g., a "hint") of a location (e.g., a row address) that matches a location (e.g., a row address) associated with an activation command 362-2.

The command timeline 360 can include one or more commands associated with one or more row access operations, including activation commands 362-1 and 362-2, data access commands 364-1 and 364-2, and a precharge command 366. The command timeline 360 can include a set of timing signals, including one or more precharge phases 368, one or more activation phases 370-1 corresponding to the activation command 362-1, and one or more activation phases 370-2 corresponding to the activation command 362-2. The precharge phases 368 can include a precharge operation 371, which, in some examples, can include a hidden portion 373. The precharge operation 371 can be associated with a tRP 372 and a row-active time (tRAS) 374. The activation phases 370-1 can include an activation operation 375, which can be associated with a tRCD 376 (e.g., a default tRCD). The tRCD 376 can be the amount of time between the memory device 222 receiving the activation command 362-1 and the memory device 222 receiving the data access command 364-1. In some examples, the tRCD 376 can be an amount of time (e.g., a minimum amount of time) that the controller can wait before sending a data access command (e.g., the data access commands 364-1 and 364-2). The activation phases 370-2 can include an activation operation 379, which can include a hidden portion 381. In some examples, the activation operation 379 can be associated with a shortened tRCD 378 relative to the tRCD 376.

The tRAS 374 can be the amount of time (e.g., clock cycles, a minimum quantity of clock cycles) between the memory device 222 receiving the activation command 362-1 and the memory device 222 receiving the precharge command 366. The tRP 372 can be the amount of time between the memory device 222 receiving the precharge command 366 and completion of the precharge operation 371.

In some examples, the hint can include more than one bit of information. A portion of the hint can be included with the activation command 362-1 and/or the precharge command 366. In some examples, the hint can enable the memory device 222 to begin the activation operation 379 substantially simultaneously with the precharge operation 371. In some examples, beginning the activation operation 379 early can result in the shortened tRCD 378. Reducing the tRCD can reduce the overall latency of the row access operation.

To initiate a row access operation, the memory device 222 can receive the activation command 362-1, which can be sent from the memory controller 200. The activation command 362-1 can be associated with opening a row of a subarray (e.g., one of the subarrays 235). The activation command 362-1 can trigger the activation phases 370-1. For example, the activation phases 370-1 can be generated by a phase generator (e.g., the phase generator 250). The activation operation 375 can be executed over the tRCD 376. In some cases, the memory controller 200 can start a timer corresponding to the tRCD 376 to determine when to send subsequent commands associated with the row access operation.

While the row is open, the memory device 222 can receive the data access command 364-1. For example, the data access command 364-1 can be a read command, a write command, or another type of data access command. The data access command 364-1 can include an instruction to access the row opened in association with the activation operation 375. Execution of the data access command 364-1 can occur after the tRCD 376.

After completing the first data access operation, the memory device 222 can receive a precharge command 366. The precharge command 366 can trigger the precharge phases 368, which can include timing or other signals for internal operations to close the row (e.g., the precharge operation 371). In some cases, the precharge command 366 can additionally include an indication (e.g., a hint) of a row associated with the activation command 362-2. In some cases, the activation command 362-1 can include an indication (e.g., a hint) of a row associated with the activation command 362-2. In some cases, the hint can include a subarray index (e.g., a row) that can be associated with the activation command 362-2. The hint can enable the memory device 222 to trigger the activation phases 370-2 before the precharge operation 371 is complete.

An overall latency for accessing a row can be reduced when the hidden portion 381 of the activation operation 379 performed on another row is performed during at least a portion of time that the precharge operation 371 for the row is still being performed (e.g., the hidden portion 381 occurs substantially simultaneously with a portion of precharge operation 371). In such examples, the hidden portion 381 of the activation operation 379 can occur before the memory device 222 receives the activation command 362-2 based on the hint. Overlapping (in time) portions of these two operations can reduce the overall latency of accessing a row.

The overall latency for accessing a row can be (further) reduced when the hidden portion 373 of the precharge operation 371 is performed during at least a portion of time that the activation operation 379 is being performed (e.g., the hidden portion 373 occurs substantially simultaneously with a portion of the activation operation 379). In such examples, the hidden portion 373 of the precharge operation 371 can occur after the memory device 222 receives the activation command 362-2. To reduce latency in such situations, the tRP can be adjusted. For example, the precharge operation 371 can be completed (e.g., the row closed) within the tRP 372. In some examples, the memory controller 200 can start a timer corresponding to the tRP 372 to determine when to send subsequent commands associated with the row access operation. In some examples, due to the time overlap (e.g., the hidden portion 373) between the precharge operation 371 and the activation operation 379, there can be a portion of the precharge operation 371 that can occur after the activation command 362-2 has been received. The hidden portion 373 can enable a reduction of the tRP 372 (e.g., tRP_S). For instance, an increase in the overlap between the precharge operation 371 and the second activation operation 379 can result in the shortened tRP 372. In some examples, the memory controller 200 can determine to start a shorter timer corresponding to the shortened tRP 372. In some examples, extending the precharge operation 371 to yield the shortened tRP 372 can be referred to as a method for tRP improvement or reduction.

In some cases, the memory controller 200 can use the shortened tRP 372 without having previously included a hint in a command. For example, if the activation command 362-2 is associated with a row of a different subarray of the memory device 222, the memory controller 200 can include the hidden portion 373 of the precharge operation 371 and, thus, enable the shortened tRP 372.

The row associated with the activation operation 379 can be in the same subarray of the memory device 222 as the row associated with the activation operation 375 or in a different subarray of the memory device 222. A reduction of the overall latency can depend on whether the two rows are in the same subarray or different subarrays. The memory device 222 can receive an activation command 362-2, which can trigger the activation phases 370-2. The second activation command 362-2 can be associated with opening a row of a subarray, which can be the location indicated in the hint within the precharge command 366.

In some examples, the location associated with the activation operation 379 can have a different subarray index (e.g., a different row) than the location associated with the activation operation 375, as shown in the command timeline 360. A hint included with the precharge command 366 can have already triggered portions of the activation phases 370-2. The shortened tRCD 378 can be shorter than the tRCD 376. For example, if the activation operation 379 is associated with a different subarray than the activation operation 375, the shortened tRCD 378 can be referred to as tRCD_DS, which can be shorter than the tRCD 376.

In some examples, the location associated with the activation operation 379 (including the hidden portion 381) can have a same subarray index (e.g., a same row) as the activation operation 375. The hint included with the precharge command 366 can have already triggered portions of the activation phases 370-2. In such examples, the hidden portion 381 can be completed before the activation command 362-2 is received (e.g., before the shortened tRCD 378). In such examples, the shortened tRCD 378 can be shorter than the tRCD 376. For example, if the activation operation 379 is associated with a same subarray as the activation operation 375, the shortened tRCD 378 can be referred to as tRCD_SS, which can be shorter than the tRCD 376.

The duration of tRCD can be variable based on various conditions, such as whether two consecutive activation operations are associated with different subarrays or the same subarray of the memory device 222. Different durations of tRCD can result in varied durations of the hidden portion 381 can for different combinations of activation operations. In some examples, the duration of the hidden portion 381 can vary based on whether the associated rows are in the different subarrays, in the same subarray, other factors, and combinations thereof. For example, the duration of tRCD can vary based on the relative locations of different subarrays within the memory device 222.

The indication can include various information about the location of the row being accessed by the activation operation 379. Non-limiting examples of the types of information that can included with the indication can include an indication of whether the rows are in different subarrays or in the same subarray, an indication of the subarray index of the subsequent row, one or more bits for the specific row address of the subsequent row, and combinations thereof. If the indication is that the subsequent row is in the same subarray or a different subarray, then the indication can include two or more bits to indicate three or more states. The three or more states can include a first state that indicates that no hint is communicated, a second state that the subsequent row can be in the same subarray, or a third state that the subsequent row can be in a different subarray. If the indication includes a subarray index of the subsequent row, the indication can use three or more bits to indicate that whether no hint is communicated or the subarray index of the next row.

In some examples, the indication can include specific and/or additional row address bits of the row associated with the activation operation 379. Such information can enable reduction of the overall latency of the row access. For example, as illustrated by FIG. 3, if the activation operation 379 occurs in a same subarray as the activation operation 375, then the duration of the tRCD 378 can be shortened relative to the tRCD 376.

Various combinations of information with the indication can achieve different latencies for row activations. In some examples, a same subarray or different subarray indication can enable the memory controller 200 to adjust the hidden portion 381 and the shortened tRCD 378. In some examples, a same subarray or different subarray indication in combination with adjustments to tRP (e.g., the tRP 372) can enable the memory controller 200 to adjust the respective durations of the hidden portion 381, the shortened tRCD 378, the hidden portion 373, and the tRP 372. In some examples, adjustments to the tRP 372 can be unrelated to a same subarray or different subarray indication. In some examples, a same subarray or different subarray indication and one or more bits indicating a specific row address of the subsequent row can enable the memory controller 200 to adjust respective durations of the hidden portion 381 and the shortened tRCD 378. In some examples, a same subarray or different subarray indication and one or more bits indicating a specific row address of the subsequent row in combination with adjustments to the tRP 372 can enable the memory controller 200 to adjust respective durations of the hidden portion 381, the shortened tRCD 378, the hidden portion 373, and the tRP 372. In some examples, a subarray index indication of the subsequent row can enable the memory controller 200 to adjust respective durations of the hidden portion 381 and the shortened tRCD 378. In some examples, a subarray index indication of the subsequent row in combination with adjustments to the tRP 372 can enable the memory controller 200 to adjust respective durations of the hidden portion 381, the shortened tRCD 378, the hidden portion 373, and the tRP 372. In some examples, a subarray index indication of the subsequent row and one or more bits indicating the specific row address of the subsequent row can enable the memory controller 200 to adjust respective durations of the hidden portion 381 and the shortened tRCD 378. In some examples, a subarray index indication of the subsequent row and one or more bits indicating the specific row address of the subsequent row in combination with adjustments to the tRP 372 can enable the memory controller 200 to adjust respective durations of the hidden portion 381, the shortened tRCD 378, the hidden portion 373, and the tRP 372.

While the subsequent row is open, the memory device 222 can receive the data access command 364-2. The data access command 364-2 can include an instruction to access a portion of memory at the row opened by the activation operation 379. The data access command 364-2 can include timing or other signals for internal operations to read, write, or otherwise access memory cells of the open row. The data access command 364-2 and any additional associated phases can occur after the shortened tRCD 378. In some examples, because the hidden portion 381 of the activation operation 379 occurs before completion of the precharge operation 371, the shortened tRCD 378 can be shorter than the tRCD 376. Thus, the indication included with the precharge command 366 can enable a reduction of the overall time of the row access operation. In some examples, the indication can be included with the activation command 362-1 (e.g., instead of in the precharge command 366).

Figure 4:
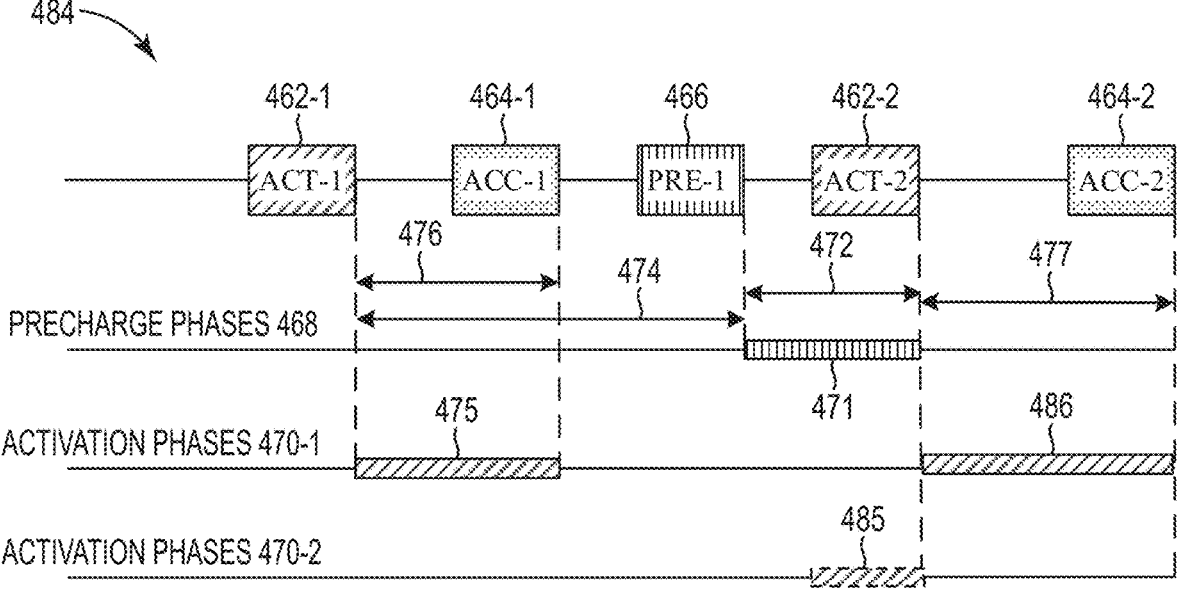
FIG. 4 illustrates an example of a command timeline for indicating row activation in accordance with a number of embodiments of the present disclosure.

FIG. 4 illustrates an example of a command timeline 484 for indicating row activation in accordance with a number of embodiments of the present disclosure. FIG. 4 illustrates an example of a "hint miss" scenario in which an activation command 462-1 and/or the precharge command 466 includes an indication (e.g., a "hint") of a location (e.g., a row address) that does not match a location (e.g., a row address) associated with an activation command 462-2. There are several situations that can result in a "hint miss." In some examples, the indicated location can be a row of the same subarray and the activation command 462-2 can be associated with a row of a different subarray. In some examples, the indicated location is a row of a different subarray and the activation command 462-2 can be associated with a row of the same subarray. In some examples, the indication can include a subarray index of the subsequent row that is different than the subarray index associated with the activation command 462-2. In some examples, the indication can include one or more row address bits of the subsequent row that do not match the row address associated with the activation command 462-2.

The command timeline 484 can include one or more commands associated with one or more row access operations, including a activation command 462-1 and a activation command 462-2, a data access command 464-1 and a data access command 464-2, and a precharge command 466. The command timeline 484 can include a set of timing signals, including one or more precharge phases 468, one or more activation phases 470-1, and one or more activation phases 470-2. The precharge phases 468 can include a precharge operation 471. The precharge operation 471 can be associated with a tRP 472 and a tRAS 474. The activation phases 470-1 can include an activation operation 475, which can be associated with a tRCD 476 and an activation operation 486, which can be associated with a tRCD 477. The activation phases 470-2 can include a portion of an activation operation 485.

A memory device (e.g., the memory device 222 described in association with FIG. 2) can begin performing portions of the activation operation 485 based on the indication. However, the activation operation 485 is ceased so that the activation operation 486 can be performed after (e.g., in response to) receiving the activation command 462-2. In some examples, the indication can enable the memory device 222 to execute a portion of the activation operation 485 substantially simultaneously with the precharge operation 471. In some examples, executing a portion of the activation operation 485 may not impact the duration of the tRCD 477 because of the hint miss.

To initiate a row access operation, the memory device 222 can receive the activation command 462-1 from the memory controller 200, for example. The activation command 462-1 can be associated with opening a row of a subarray of the memory device 222. The activation command 462-1 can trigger the activation phases 470-1, which can include timing or other signals for internal operations to open the row. The activation operation 475 can be executed during the tRCD 476. In some examples, the memory controller 200 can start a timer corresponding to the tRCD 476 to determine when to send subsequent commands associated with the row access operation.

While the row is open, the memory device 222 can receive the data access command 464-1. The data access command 464-1 can include an instruction to access a portion of memory of the open row. The data access command 464-1 can occur after the tRCD 476.

After completion of the data access operation, the memory device 222 can receive the precharge command 466. The precharge command 466 can trigger the precharge phases 468, which can include timing or other signals for internal operations to close the open row (e.g., the precharge operation 471). In some examples, the precharge command 466 can include an indication of the location of the activation command 462-2. In some examples, the indication can include whether the subarray associated with the activation command 462-2 will be different than or the same as the subarray of the activation command 462-1, a subarray index (e.g., a row) that can be associated with the activation command 462-2, specific row address bits associated with the data access command 464-2, and combinations thereof. The indication can enable the memory device 222 to trigger the activation phases 470-2 before the precharge operation 471 is complete. For example, the memory device 222 can execute a portion of the activation operation 485 (e.g., can begin to open another row) based on the indication.

In some examples, the activation command 462-2 can have a different subarray index (e.g., a different row) than the activation operation 462-1. In some examples, the activation command 462-2 can have the same subarray index (e.g., the same row) as the activation operation 462-1. The activation command 462-2 can trigger the activation phases 470-1, which can include timing or other signals for internal operations to open the subsequent row (e.g., the activation operation 486). Because a portion of the activation operation 485 may have been performed on a row that does not match the second activation command 462-2, the memory device 222 can perform the activation operation 486 on the associated row (e.g., the row associated with the activation command 462-2). Thus, the tRCD 477 associated with the activation operation 486 can be a default tRCD. In some examples, the memory controller 200 can start a timer corresponding to the tRCD 476 to determine when to send subsequent commands associated with the row access operation.

In some examples, the memory device 222 can reduce the tRP 472 based on overlapping a portion of the pre-charge operation 471 with a portion of the activation operation 486. In some examples of a hint miss and tRP reduction, the memory device 222 can revert to a default tRP duration for the tRP timer and complete the precharge operation 471 before performing the activation operation 486. In some examples of a hint miss, the memory device 222 can maintain the shorter tRP 472 (e.g., the tRP_S).

While the subsequent row is open, the memory device 222 can receive the data access command 464-2. The data access command 464-2 can include an instruction to access a portion of memory of the row opened by the second activation operation 486. The data access command 464-2 can trigger timing or other signals for internal operations to read, write, or otherwise access memory cells at the open row. The data access command 464-2 can occur after the tRCD 477. In some examples, the tRCD 477 associated with the activation operation 486 can be longer than the tRCD 378 described in association with FIG. 3 because of the hint miss.

Some embodiments of the present disclosure can include retrieving, from a register (e.g., the capability registers 123 described in association with FIG. 1A) of a memory device (e.g., the memory devices 122) of a memory module (e.g., the memory module 111), an indication of bit locations of row addresses of the memory device associated with an optimization of a tRP of the memory device. An indication of different bit locations of the row addresses of the memory device associated with an optimization of a tRCD of the memory device can be retrieved from the register of the memory device. An indication of particular subarrays of the memory device to use in associated with the optimization of the tRCD can be retrieved from the register of the memory device.

Some embodiments can include retrieving, from a different register (e.g., the configuration registers 124) of the memory device, bits indicative of whether the optimization of the tRP is enabled. Responsive to the bits being indicative that the memory device the optimization of the tRP is enabled, the tRP can be adjusted. Some embodiments can include retrieving, from a (different) register (e.g., the configuration registers 124) of the memory device, bits indicative of whether the memory device the optimization of the tRCD is enabled. Responsive to the bits being indicative that the memory device the optimization of the tRCD is enabled, the tRCD can be adjusted.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device;
a first register coupled to the memory device and configured to store an indication of a first number of bit locations of a row address corresponding to the memory device to use in association with optimization of a row precharge time (tRP) of the memory device; and
a second register coupled to the memory device and configured to store an indication of a second number of bit locations of the row address to use in association with optimization of a row address to column address delay (tRCD) of the memory device.

2. The apparatus of claim 1, wherein the indication of the first number of bit locations of the row address is indicative that the memory device supports optimization of the tRP.

3. The apparatus of claim 2, wherein the indication of the first number of bit locations of the row address being 0000B is indicative that the memory device does not support optimization of the tRP.

4. The apparatus of claim 1, wherein the indication of the second number of bit locations of the row address is indicative that the memory device supports optimization of the tRCD.

5. The apparatus of claim 4, wherein the indication of the second number of bit locations of the row address being 0000B is indicative that the memory device does not support optimization of the tRCD.

6. The apparatus of claim 1, wherein the memory device comprises a plurality of subarrays, and
wherein the second register is further configured to store an indication of a quantity of subarrays of the plurality of subarrays to use in association with optimization of the tRCD.

7. The apparatus of claim 1, wherein the memory device comprises a plurality of subarrays,
wherein the second register is further configured to store an indication of a number of particular subarrays of the plurality of subarrays to use in association with optimization of the tRCD, and
wherein the row address is associated with at least one of the number of particular subarrays.

8. The apparatus of claim 1, wherein the memory device comprises a plurality of subarrays, and
wherein the row address is associated with at least one of the plurality of subarrays.

9. The apparatus of claim 1, further comprising a memory controller coupled to the memory device and comprising the first and second register.

10. The apparatus of claim 9, wherein the memory controller and the memory device are components of a Compute Express Link (CXL) compliant memory system.

11. The apparatus of claim 1, wherein the apparatus comprises a Compute Express Link (CXL) compliant memory system.

12. A method, comprising:
retrieving, from a register of a memory device of a memory module, an indication of a first number of bit locations of a plurality of row addresses of the memory device associated with an optimization of a row precharge time (tRP) of the memory device;
retrieving, from the register of the memory device, an indication of a second number of bit locations of the plurality of row addresses of the memory device associated with an optimization of a row address to column address delay (tRCD) of the memory device; and
retrieving, from the register of the memory device, an indication of a number of particular subarrays of the memory device to use in associated with the optimization of the tRCD.

13. The method of claim 12, further comprising:
retrieving, from a different register of the memory device, a first number of bits indicative of whether the optimization of the tRP is enabled; and
retrieving, from the different register of the memory device, a second number of bits indicative of whether the optimization of the tRCD is enabled.

14. The method of claim 13, further comprising:
responsive to the first number of bits indicating that the the optimization of the tRP is enabled, adjusting the tRP; and
responsive to the second number of bits indicating that the the optimization of the tRCD is enabled, adjusting the tRCD.

15. An apparatus comprising:
a number of memory devices; and
a controller coupled to the number of memory devices and configured to:
responsive to a respective first register of at least one of the number of memory devices storing a first number of bits indicative that an optimization of a row precharge time (tRP) of the memory device is enabled:
adjust the tRP based on an indication of a first number of bit locations of a first plurality of row addresses of the memory device stored in a register of the controller; and
responsive to the respective first register of the at least one of the number of memory devices storing a second number of bits indicative that an optimization of a row address to column address delay (tRCD) of the memory device is enabled:

adjust the tRCD based on an indication of a second number of bit locations of a second plurality of row addresses of the memory device stored in a respective second register of the at least one of the number of memory devices.

16. The apparatus of claim 15, wherein the controller is further configured to manage a command queue and a command schedule based on data stored in the register of the controller.

17. The apparatus of claim 15, wherein the first plurality of row addresses comprise the second plurality of row addresses.

18. The apparatus of claim 15, wherein the first plurality of row addresses correspond to a first subarray of a bank of the memory device, and wherein the second plurality of row addresses correspond to a second subarray of the bank.

19. The apparatus of claim 15, wherein the at least one of the number of memory devices comprises a first bank and a second bank, wherein the first plurality of row addresses and the second plurality of row addresses correspond to the first bank and the second bank, and wherein the controller is further configured to manage the second bank as a subarray of the first bank.

20. The apparatus of claim 15, wherein the first register comprises a first portion of a single register of the memory device, and wherein the second register comprises a second portion of the single register.

* * * * *